US009548410B2

(12) United States Patent
Aleksov et al.

(10) Patent No.: US 9,548,410 B2
(45) Date of Patent: Jan. 17, 2017

(54) PHOTOVOLTAIC WINDOW

(71) Applicant: Intel Corporation, Santa Clara, CA (US)

(72) Inventors: Aleksandar Aleksov, Chandler, AZ (US); Brian S. Doyle, Portland, OR (US); Ravindranath V. Mahajan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 670 days.

(21) Appl. No.: 13/717,186

(22) Filed: Dec. 17, 2012

(65) Prior Publication Data

US 2014/0166080 A1 Jun. 19, 2014

(51) Int. Cl.
*H01L 31/048* (2014.01)
*H01L 27/30* (2006.01)
*H02S 20/26* (2014.01)

(52) U.S. Cl.
CPC ......... *H01L 31/0488* (2013.01); *H01L 27/301* (2013.01); *H02S 20/26* (2014.12); *Y02B 10/10* (2013.01); *Y02E 10/50* (2013.01)

(58) Field of Classification Search
CPC ..... H01L 31/0488; H01L 27/301; H02S 20/26
See application file for complete search history.

(56) References Cited

U.S. PATENT DOCUMENTS

| 6,469,243 | B2 * | 10/2002 | Yamanaka | ........... | H01G 9/2031 |
| | | | | | 136/244 |
| 6,756,537 | B2 * | 6/2004 | Kang | .................. | H01G 9/2009 |
| | | | | | 136/252 |
| 6,878,871 | B2 * | 4/2005 | Scher | ..................... | B82Y 10/00 |
| | | | | | 136/252 |
| 2001/0004901 | A1 * | 6/2001 | Yamanaka | ........... | H01G 9/2031 |
| | | | | | 136/263 |
| 2002/0040728 | A1 * | 4/2002 | Yoshikawa | .......... | H01G 9/2009 |
| | | | | | 136/263 |

(Continued)

OTHER PUBLICATIONS

Humphries, "Sharp develops see-through solor panel for windows", Sep. 27, 2012, downloaded from http://www.geek.com/articles/news/sharp-develops-see-through-solar-panel-for-windows-20120927/, 2 pages.

(Continued)

*Primary Examiner* — Golam Mowla
(74) *Attorney, Agent, or Firm* — Grossman, Tucker, Perreault & Pfleger, PLLC

(57) ABSTRACT

An apparatus for collecting solar energy, including a first panel, wherein the first panel allows at least 50% of incident light having a wavelength in the range of 1 nm to 1,500 nm to pass through said panel and a second panel, wherein the second panel allows at least 50% of incident light having a wavelength in the range of 410 nm to 650 nm to pass through said panel. A photovoltaic cell is disposed between the first panel and second panel, which includes a first electrode disposed adjacent to the first panel, a second electrode disposed adjacent to the second panel, a photovoltaic component contacting the first and second electrodes. The photovoltaic component absorbs at least 50% of light having a wavelength in one of the following ranges: greater than 650 nm, less than 410 nm and combinations thereof.

17 Claims, 17 Drawing Sheets

(56) References Cited

U.S. PATENT DOCUMENTS

| | | | |
|---|---|---|---|
| 2006/0185714 A1* | 8/2006 | Nam | H01G 9/2031 136/244 |
| 2007/0144576 A1* | 6/2007 | Crabtree | B32B 17/10018 136/251 |
| 2008/0216891 A1* | 9/2008 | Harkness | H01L 31/0352 136/256 |
| 2012/0073631 A1* | 3/2012 | Ikenaga | C08F 255/02 136/251 |

OTHER PUBLICATIONS

Alabaster, "3M Film Turns Windows Into Transparent Solar Panels", Oct. 5, 2012, downloaded from http://www.pcworld.com/article/241152/3m_film_turns_windows_into_transparent_solar_panels.html, 1 page.

Wrenn, How your windows could be the future of electricity: Scientists create transparent solar panels out of 'glass-like' plastic, Jul. 23, 2012, downloaded from http://www.dailymail.co.uk/sciencetech/article-2177763/Scientists-create-transparent-solar-panels-glass-like-plastic.html, 2 pages.

Goossens, "Clear Solar Film Means Power From Windows, UCLA Says," Jul. 24, 2012, downloaded from http://www.bloomberg.com/news/2012-07-24/clear-solar-film-means-power-from-windows-ucla-says.html, 2 pages.

Carrasco-Orozco et al., "New Photovoltaic Concept: Liquid-Crystal Solar Cells Using a Nematic Gel Template", Jun. 27, 2006.

Bryner, "Powerful Ideas: Spray-On Solar Cells", Aug. 24, 2009, downloaded from htpp://www.livescience.com/1055-powerful-ideas-spray-solar-cells.html, 2 pages.

"Liquid Crystal-Based Photovoltaic Cells", Desert Research Institute, downloaded from http://www.dri.edu/nvrec/nvrec-projects-and-objectives/3429-liquid-crystal-based-photovoltaic-cells, captured on Dec. 14, 2012, 1 page.

"Liquid Solar Cells", Solar Power-PV Panels, dowloaded from http://solarpowerpanels.ws/solar-panels/liquid-solar-cells, captured on Dec. 14, 2012, 3 pages.

"Liquid Junction Photovoltaic Device Investigation—As compared to a dry cell", Nov. 30, 2011, 8 pages.

"Alternative Energy—Photovoltaics, Ionic Liquids, and MOFs", Material Matters, vol. 4, No. 4, 2009, 32 pages.

\* cited by examiner

PHOTOVOLTAIC WINDOW

FIELD

The present disclosure relates to a photovoltaic window, a system thereof, and related methods.

BACKGROUND

Windows, and particularly glass windows, provide a degree of functionality as well as aesthetics. Windows may comprise a relatively large surface area in today's buildings and homes, particularly in modern high-rise buildings where entire exterior façades are covered with windows. Windows allow for passive use of solar energy by permitting light and heat from the sun pass into an interior space for illumination and warmth. However, there remains a desire to actively harness solar energy and, in particular, by using the relatively large surface area available in windows to capture this energy.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

The present application is directing to utilizing windows for collecting solar energy, radiant light from the sun, as well as energy from other light sources. As noted above, various surfaces, such as windows in a building, particularly those of modern high rise buildings, provide a relatively large surface area. Herein, this surface area, be it relatively large or small, is utilized to harness light energy by incorporating one or more photovoltaic cells. A photovoltaic cell is understood as an electrical device that converts the energy of light into electricity by the photovoltaic effect, wherein voltage or an electric current is created in a material upon exposure to light.

In a broad sense, the present disclosure may be directed to an apparatus for collecting solar energy, including a first panel, wherein the first panel allows at least 50% of incident light having a wavelength in the range of 1 nm to 1,500 nm to pass through said panel and a second panel, wherein the second panel allows at least 50% of incident light having a wavelength in the range of 410 nm to 650 nm to pass through said panel. A photovoltaic cell is disposed between the first panel and second panel, which includes a first electrode disposed adjacent to the first panel, a second electrode disposed adjacent to the second panel, and a photovoltaic component contacting the first and second electrodes. The photovoltaic component absorbs at least 50% of light having a wavelength in one of the following ranges: greater than 650 nm, less than 410 nm and combinations thereof. The photovoltaic component generates current from the absorbed light and may include photovoltaic materials, photo-sensitive dyes, semi-conductors, etc. In embodiments, the photovoltaic component includes a photodiode. In other embodiments, the photovoltaic component includes fluid constituent and, optionally a solid constituent that when combined with the fluid constituent form the photovoltaic component.

Figure 1:
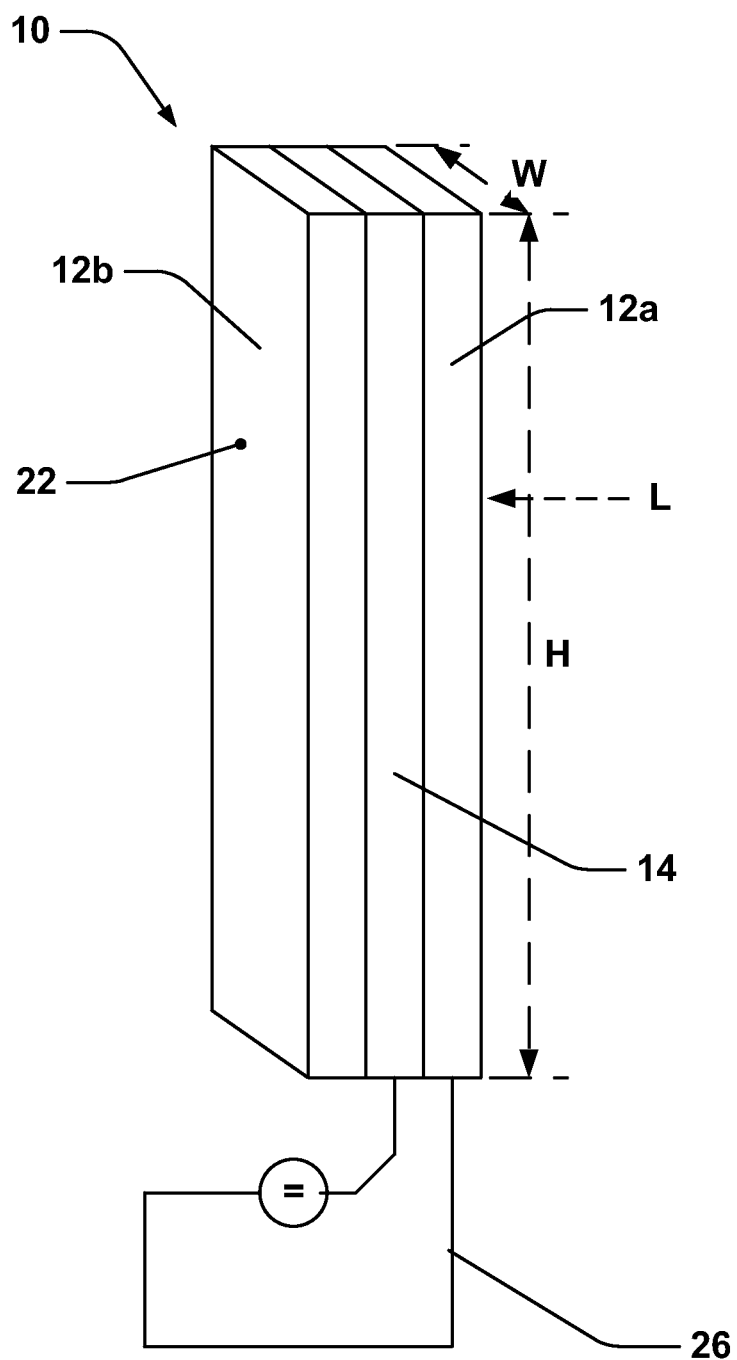
FIG. 1 illustrates a cross-sectional side view of a window for collecting solar energy.

FIG. 1 illustrates an apparatus for collecting solar energy in the form of a window 10. The window 10 includes two panels 12a, 12b (hereinafter 12) with a photovoltaic cell 14 positioned therebetween. While only two panels are illustrated, additional panels are optionally present, such as three, four or more panels. The individual panels each include one layer of a material or multiple layers of material that are laminated together.

At least one of the panels 12a, such as an exterior panel or a panel oriented towards the primary light source (e.g., the sun), allows at least 50% of incident light L, including all values and ranges therein, having one or more wavelengths in the range of 1 nm to 1,500 nm, including all values and ranges therein to pass through the panel. In examples, at least 60%, at least 65%, at least 70%, at least 75%, at least 80%, at least 85%, at least 90%, or at least 95% of incident light passes through the panel exhibiting wavelengths from 1 nm to 410 nm, 410 nm to 650 m, or 650 nm to 1,500 nm. Incident light is understood as light that strikes a surface. Stated another way, the panels 12 are generally semi- to fully-transparent, allowing incident light to pass through without scatter of the photons. In addition, the panels may also be translucent, wherein photons of the incident light is scattered at the surfaces or interior of the panels, provided at least 50% of the incident light L passes through the panel.

The remainder of the panels 12b, positioned opposite to the panel(s) oriented toward the primary light source (such as the sun), allows at least 50% of incident light L having one or more wavelengths in the range of 410 nm to 650 nm to pass through the panel. In examples, at least 60%, at least 65%, at least 70%, at least 75%, at least 80%, at least 85%, at least 90%, or at least 95% of incident light passes through the panel exhibiting wavelengths from 410 nm to 450, 450 nm to 495 nm, 495 nm to 570 nm, 570 nm to 590 nm, 590 nm to 650 nm. In non-limiting examples, the material forming the panels includes glass, polycarbonate, acrylic, etc. The panels 12b are, therefore, also generally semi- to fully-transparent to the wavelengths noted above, allowing incident light to pass through with or without scatter and absorption of the photons.

As further illustrated in FIG. 2, the photovoltaic cell 14 includes electrodes 16a, 16b (hereinafter 16) and a photovoltaic component 18, such as a photodiode, positioned between the panels 12. The electrodes 16 are disposed adjacent to the interior surfaces 20a, 20b (hereinafter 20) of the panels 12. As illustrated, the electrodes 16 are contacted by the photodiode 18.

In non-limiting examples, the electrodes are formed of a transparent conductive oxide such as indium tin oxide (ITO) or indium-doped zinc oxide, silver, gold, graphene, single walled carbon nanotubes (SWNT), calcium, aluminum, gallium, inherently conductive polymers such as polyaniline, polythiophene, and poly(3,4-ethylenedioxythiophene) poly(styrenesulfonate) (PEDOT:PSS), and combinations thereof. Each electrode is formed from the same materials, different materials or combinations of materials. The electrodes 16 are deposited on, cast on, laminated to, or positioned adjacent to the interior surfaces 20a, 20b of the panels. In one embodiment, the electrodes can be applied to the panels, photodiode or both, through chemical vapor deposition or physical vapor deposition, including magnetron sputtering. In another embodiment, the electrodes are melt processed into a film. In further embodiments, the electrodes are cast onto the panels, the photodiode or both.

Individually, the electrodes allow at least 50% of incident light L having one or more wavelength in the range of 410 nm to 650 nm. In examples, at least 60%, at least 65%, at least 70%, at least 75%, at least 80%, at least 85%, at least 90%, or at least 95% of incident light passes through the panel exhibiting wavelengths from 410 nm to 450, 450 nm to 495 nm, 495 nm to 570 nm, 570 nm to 590 nm, 590 nm to 650 nm. Again, the electrodes are generally semi to fully transparent to the wavelengths noted above, allowing incident light to pass through with or without scatter of the photons.

Referring again to FIG. 1, the photovoltaic component 18 is illustrated as being coextensive with the panels 12, extending along both the height "H" and width "W" the panel face 22. In embodiments, more than one photovoltaic cell(s) is arranged in between the panels 12 as illustrated in FIG. 3, which is a sectional view of FIG. 2 taken at line 3-3. As illustrated, more than one photovoltaic cells 14a, 14b, 14c, 14d are arranged in a single layer and non-overlapping manner between the panels. While FIG. 3 illustrates four photovoltaic cells dividing the window into four segments, more than four cells, such as from two cells to 100,000 cells, including all values and ranges therein, such as 4 cells, 10 cells, 20 cells, 500 cells, 1,000 cells, etc., may be present. Furthermore, while FIG. 3 illustrates the four photovoltaic cells splitting the window 10 generally along the height "H" of the window, the window may be split through the width "W" as well as at various angles that are not perpendicular to the edges of the window 10. In addition, while the photovoltaic cells are illustrated as being generally rectangular, other configurations are available, including circular, square, octagonal, hexagonal, etc.

The photovoltaic component 18 absorbs at least 50% of incident light L having 1) one or more wavelengths in the range of less than 410 nm, such as between 1 nm to 410 nm, including all values and ranges therein, such as in the range of 10 nm to 100 nm, 100 nm to 410 nm, etc.; 2) one or more wavelengths in the range of greater than 650 nm, such as between 650 nm to 1,500 nm, including all values and ranges therein, such as in the range of 650 nm to 850 nm, etc. or 3) in both ranges of less than 410 nm and greater than 650 nm.

In this embodiment, the photovoltaic component 18 also allows at least 50% of incident light L having one or more wavelengths in the range of 410 nm to 650 nm to pass through. In examples, at least 60%, at least 65%, at least 70%, at least 75%, at least 80%, at least 85%, at least 90%, at least 95%, or up to 100% of incident light passes through the panel exhibiting wavelengths from 410 nm to 450, 450 nm to 495 nm, 495 nm to 570 nm, 570 nm to 590 nm, 590 nm to 650 nm. In certain embodiments, the photovoltaic component allows all at least 50% of light in the visible wavelengths (i.e., 410 nm to 650 nm) produced by the sun to pass through the photodiode. Again, the photovoltaic component is generally semi- to fully-transparent to the wavelengths noted above, allowing incident light to pass through with or without scatter of the photons.

The photovoltaic component 18 is formed of one or more layers. In some, non-limiting embodiments, the photovoltaic component is a bilayer material, wherein one layer is an electron acceptor and the other layer is an electron donor; a heterojunction cell, wherein the donor and acceptor materials are blended together; or a graded heterojunction cell, wherein the electron donor and acceptor are mixed together in such a manner to form a gradient of the presence of the donor and acceptor through the thickness of the material. Photovoltaic materials that may be used in the photovoltaic component include, for example, inorganic materials, organic materials or both. Inorganic materials include silicon, germanium, bismuth ferrite, gallium nitride, indium gallium nitride, aluminum gallium nitride, aluminum gallium indium nitride, alkali antimonies, alkali halogenides, CsAu, etc. Organic materials include, for example, polyacetylene, polythiophenes including poly(3-methyl-thiopene), poly(p-phenylene vinylene) (PPV) and its derivatives poly[2-methoxy-5-(2'-ethylhexyloxyf)-p-phenylene vinylene] (MEH-PPV) or poly[2-methoxy-5-(3',7'-dimethyloctyloxy)-1,4-phenylenevinylene] MDMO-PPV, poly (naphthalene vinylene), and bi-layers of octabutoxy tin naphthalocyanine dichloride/$C_{60}$, CdS/CdTe, CdS/CIGS, Cd/SCZTS, copper phthalocyanine/3,4,9,10-perylenetetracarboxylic bis-benzimidazole, $C_{60}$/ME-PPV, PPV/$C_{60}$ and other combinations of the above.

In embodiments, the photovoltaic component is formed directly on the electrodes or the photovoltaic component is formed and laminated between the electrodes. For example, a photovoltaic component is directly formed on one or both of the electrodes by chemical or physical vapor deposition. In another example, the photovoltaic component is formed directly on an electrode by casting the photovoltaic component in solution onto on or both electrodes. In a further example, the photovoltaic component is formed into a film by solvent or melt processing techniques, such as extrusion, and then positioned between the electrodes.

Figure 4A:
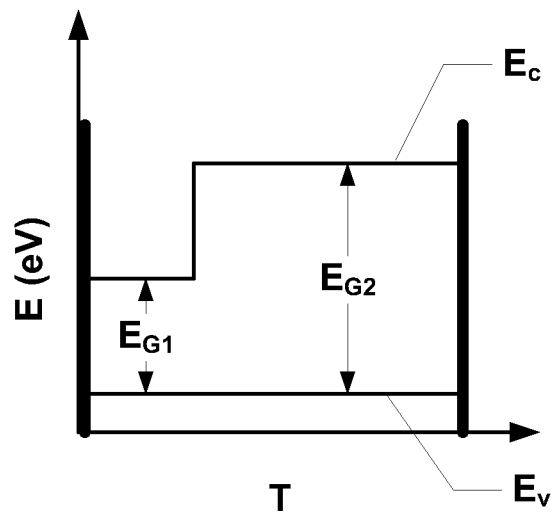
FIG. 4A is an example of an idealized band diagram, without an applied voltage, for a photovoltaic cell including two layers of photovoltaic material illustrating the different band gaps for each of the photovoltaic material layers.
Figure 4B:
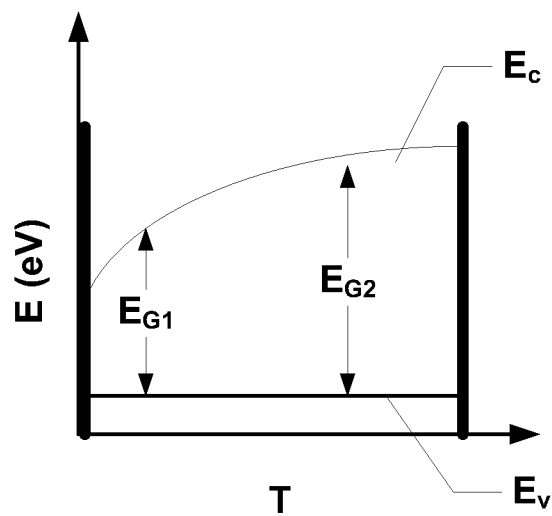
FIG. 4B is an example of an idealized band diagram, without applied voltage, for a photovoltaic component that exhibits a gradiated band gap across the thickness of the material.

In non-limiting embodiments, the photovoltaic component exhibits a bandgap of 3.0 eV or greater, including all values and increments in the range of 3.0 eV to 6 eV. Alternatively or in addition, the photovoltaic component may exhibit a bandgap of 1.9 eV or less, including all values and increments in the range of 0.1 eV to 1.9 eV. Bandgaps between 1.9 eV and 3.0 eV may be exhibited as well, or excluded. FIG. 4A illustrates an example of an idealized band diagram without applied voltage illustrating energy eV (E) versus thickness (T) for a photovoltaic component 18 constructed of two layers of photovoltaic material, wherein one layer exhibiting a relatively high band gap of 3.0 eV or greater and one material exhibiting a relatively low band gap of 1.9 eV or less. As can be seen, the difference between the conduction band energy Ec and the valance band energy Ev, i.e., the bandgap energy $E_{G1}$ and $E_{G2}$, increases in a single step at the junction of the two materials across the thickness (T) of the photovoltaic component. FIG. 4B illustrates an example of an idealized band diagram without applied voltage illustrating energy eV (E) versus thickness (T) for a photovoltaic component 18 constructed of a material that exhibits a gradient in bandgap energy across the thickness of the material from a first band gap energy $E_{G1}$ to a second band gap energy $E_{G2}$.

Figure 2:
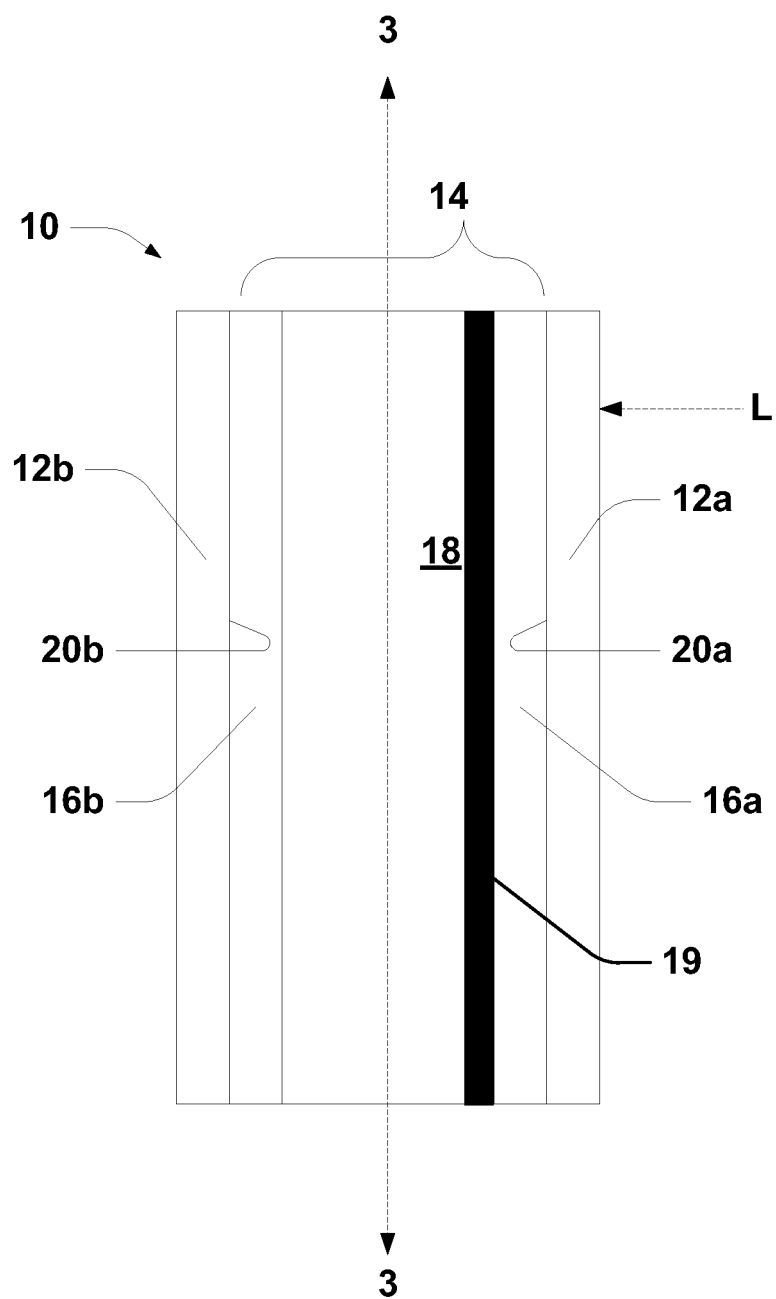
FIG. 2 illustrates a cross-sectional side view of a window for collecting solar energy.
Figure 3:
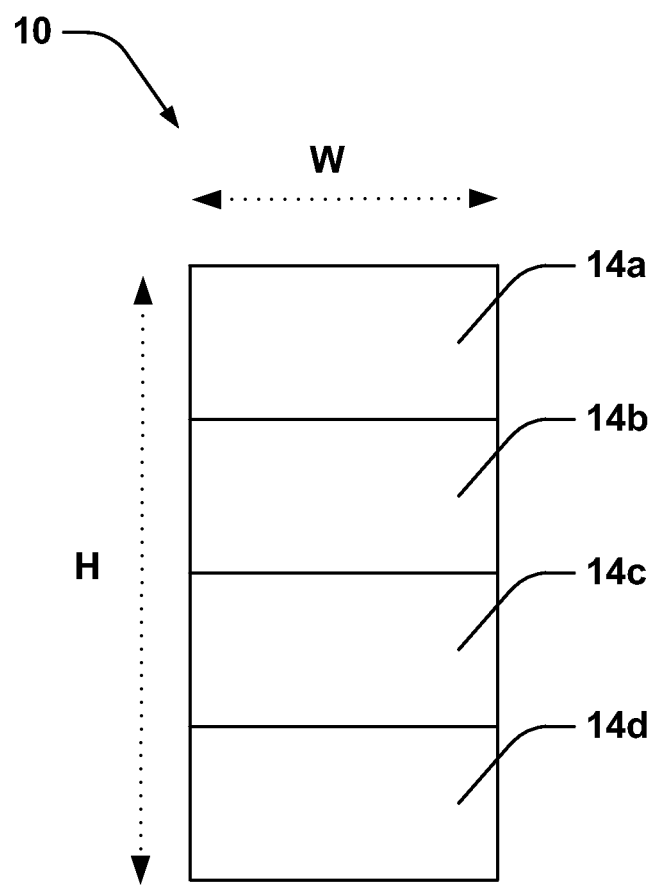
FIG. 3 illustrates a cross-sectional front view of the window of FIG. 1, wherein a plurality of photovoltaic cells are arranged in a co-planar, non-overlapping manner.

In embodiments, as illustrated in FIG. 2, an optional UV absorber 19 may be utilized as a layer in the window, or specifically incorporated into the photovoltaic cell. The UV absorber may be understood as a relatively wide-bandgap material that absorbs UV, i.e., absorbs at least 50% of incident light having a wavelength in the range of 1 nm to 410 nm, including all values and increments therein, such as 75% or greater, 90% or greater, etc. The UV absorber may be positioned proximal to the face of the window upon which sunlight is incident, such as between panel 12a and photodiode 18. In such a manner, the UV absorber may shield other elements of the cell, such as organic infrared absorbing photovoltaic materials, from UV degradation.

With reference again to FIG. 1, circuitry 26 is also provided, to which the photovoltaic cells are operatively coupled and is configured to supply the collected energy to a power supply and distribution system. For example, the electrodes may be patterned to provide electrical contacts to the photovoltaic cell or to contact an actuator, such as a piezo-element (described further herein) or other switching devices. The circuitry 26 may also include, for example, an inverter and optionally a charge controller and one or more batteries. The circuitry may also include various switches and other controllers for turning individual windows on and off and regulating a plurality of windows in the system.

Figure 5:
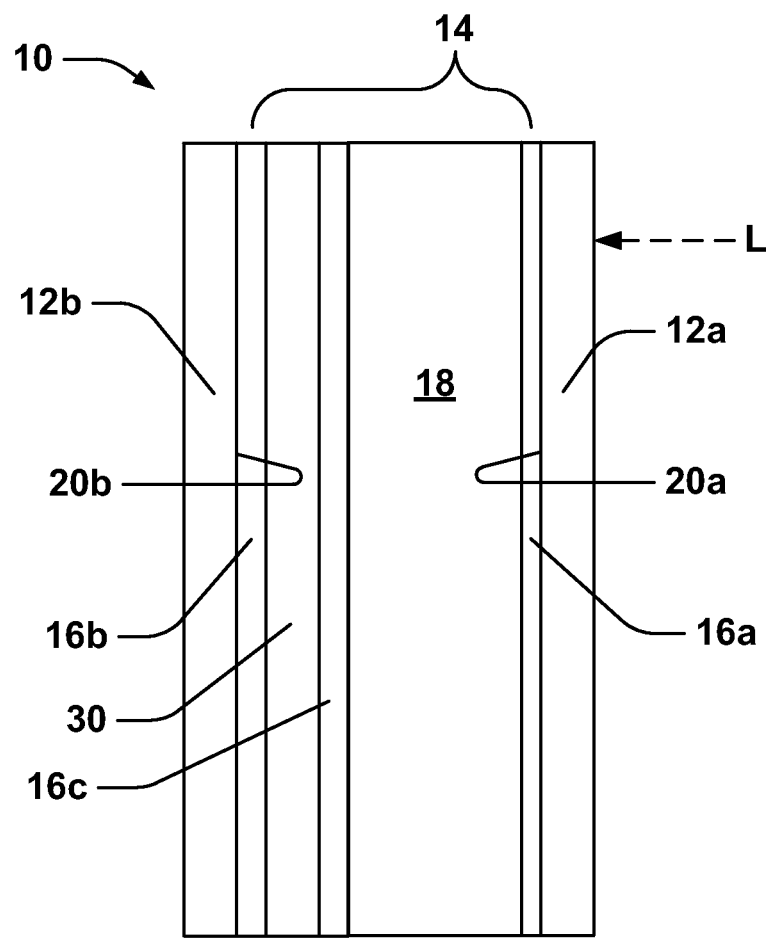
FIG. 5 illustrates a cross-sectional side view of a window for collecting solar energy including a piezo-electric element for applying a stress to the photovoltaic component.

FIG. 5 illustrates the inclusion of a piezo-element into a photovoltaic cell, including those described above, to adjust the bandgap of the photovoltaic component. The piezo-element 30 is used or activated to apply stress to the photovoltaic component 18 to either induce stress or reduce stress in the photovoltaic component, altering the bandgap. Activation of the piezo-element is understood herein as the application of a voltage to the piezo-element to cause deformation of the piezo-element, wherein the piezo-element changes dimension, i.e., to expand or contract along one or more axis. The piezo-element is directly or indirectly mechanically coupled to the photovoltaic component.

Without being bound to any particular theory, a reduction in bandgap enhances the efficiency of absorption, through absorbing a greater spectrum of light wavelengths, such as in the visible, UV, IR and combinations thereof, and bringing absorption closer to maximum solar emission. Compressive stress reduces the bandgap of the photovoltaic component such as GaN, Si, Ge, InGaN, and $BiFeO_3$. For example, $BiFeO_3$ exhibits an unstressed bandgap of ~2.7 eV and a bandgap of 2.0 eV at a stress level of 10 GPa. In embodiments, the piezo-element requires power only when changing state (from stressed to unstressed), not to hold a given state. Further, the reduction in bandgap results in a reduction in the transparency of the photovoltaic component, wherein it may become partially opaque, as a larger portion of wavelengths of visible (or UV) light is absorbed.

In such embodiments, the photovoltaic component, in the stressed state, may absorb at least 50% of incident light L having 1) one or more wavelengths in the range of less than 410 nm, such as between 1 nm to 410 nm, including all values and ranges therein, such as in the range of 10 nm to 100 nm, 100 nm to 410 nm, etc.; 2) one or more wavelengths in the range of greater than 650 nm, such as between 650 nm to 1,500 nm, including all values and ranges therein, such as in the range of 650 nm to 850 nm, etc.; 3) one or more wavelengths in the range of 410 nm to 650 nm, including all values and ranges therein; 4) in both ranges of less than 410 nm and greater than 650 nm; or 5) in all of the ranges above. In examples at least 60%, at least 70%, at least 80% or at least 90% of light may be absorbed. In addition, disposed between the piezo-element 30 and photovoltaic component 18 is, optionally, a third electrode 16c.

In embodiments, the photovoltaic component is pre-stressed, such that it exhibits a lower bandgap and absorbs a larger portion of wavelengths of light than in the unstressed state. The piezo-element then produces stress in the opposite direction, that is, it reduces the stress in the pre-stressed photovoltaic component. In the normal state, the pre-stressed state, the window is relatively more opaque and has a relatively higher efficiency. In the reduced stressed state, the window is relatively less opaque, more transparent and has a relatively lower efficiency.

Figure 6:
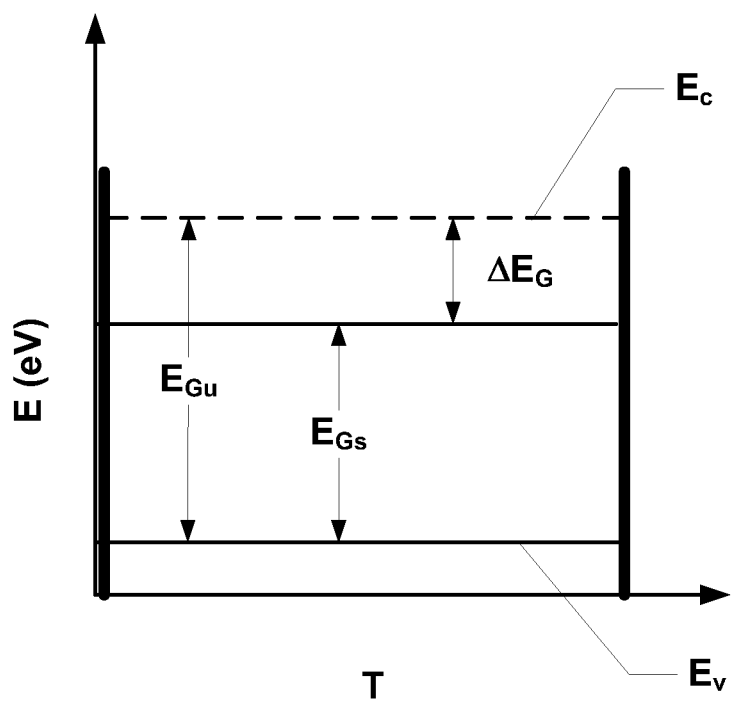
FIG. 6 is an example of an idealized band diagram, without applied voltage, illustrating the difference in band gap energy for a photovoltaic component in stressed and unstressed states.

FIG. 6 is an idealized band diagram of energy (E) v. thickness (T) of the photovoltaic component, without applied voltage, illustrating the change in energy gap $\Delta E_G$ from a reduced stress state exhibiting an unstressed bandgap energy $E_{Gu}$, to an increased stress state, exhibiting a stressed bandgap energy $E_{Gs}$, wherein $E_{Gu}$ is greater than $E_{Gs}$, and $\Delta E_G$ is the difference of $E_{Gu}$ and $E_{Gs}$.

Similar to the electrodes, the piezo-element allows at least 50% of incident light L having one or more wavelength in the range of 410 nm to 650 nm to pass through. In examples, at least 60%, at least 65%, at least 70%, at least 75%, at least 80%, at least 85%, at least 90%, or at least 95% of incident light passes through the panel exhibiting wavelengths from 410 nm to 450, 450 nm to 495 nm, 495 nm to 570 nm, 570 nm to 590 nm, 590 nm to 650 nm.

Figure 7A:
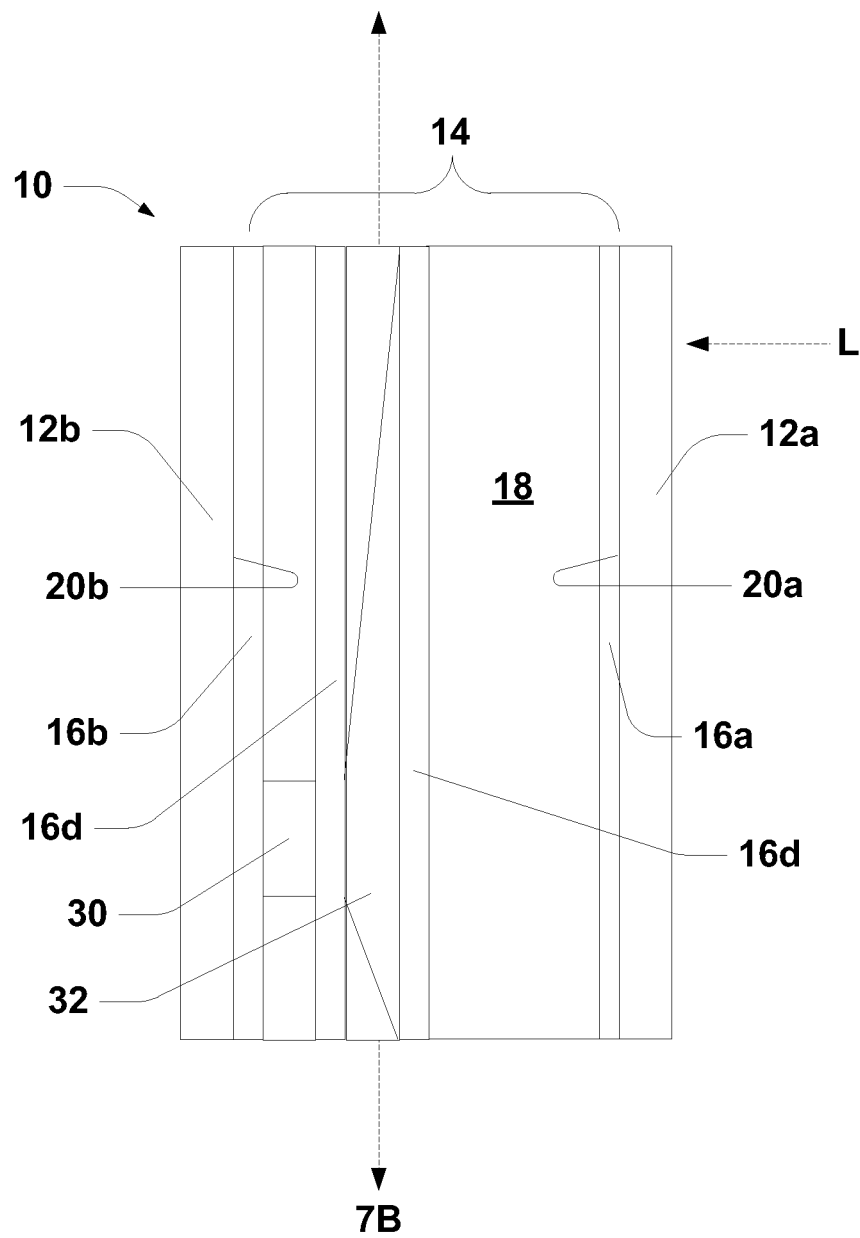
FIG. 7A illustrates a cross-sectional side view of a window for collecting solar energy, wherein the piezo-element is relatively smaller in area than the face of the window.
Figure 7B:
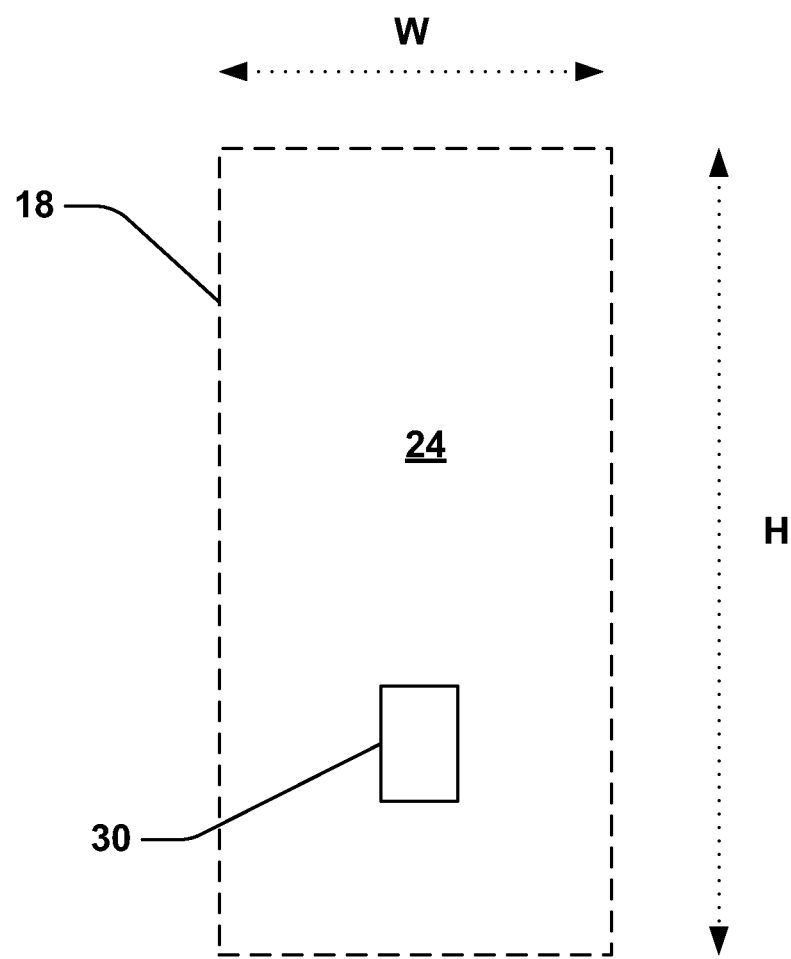
FIG. 7B illustrates a cross-sectional front or face view of the window of FIG. 7A.

In any of the above embodiments, such as that illustrated in FIG. 5, the piezo-element 30 is coextensive with the face of the photovoltaic component 18 along its height and width. Alternatively, as illustrated in FIGS. 7A and 7B, the piezo-element 30 is coextensive with only a portion of the height and width of photovoltaic component face 24, rather than the entire photovoltaic component. For example, the piezo-element may exhibit an area that is 50% or less than the area of the photovoltaic component face, including all values and ranges from 10% to 50% of the area of the photovoltaic component face.

Figure 8:
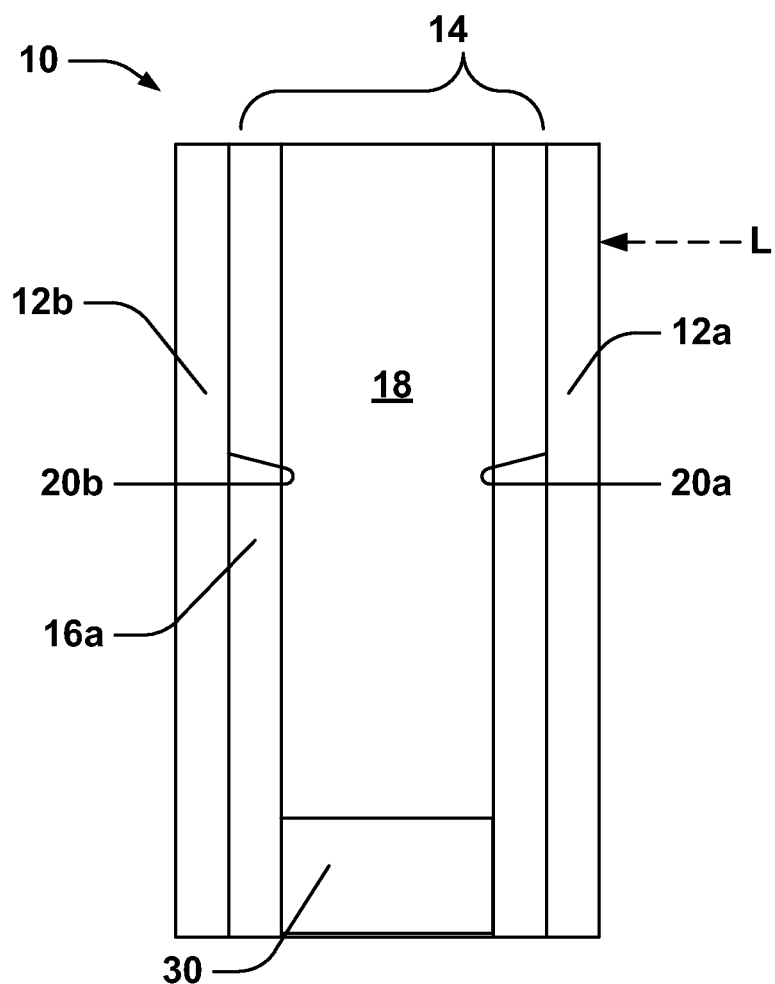
FIG. 8 illustrates a cross-sectional side view of a window wherein the piezo-element is arranged co-planar with the photovoltaic component.

Further, a stress transmitting element 32, such as a relatively rigid film is positioned between the piezo-element and the photovoltaic component 18. The stress transmitting element includes for example, polycarbonate, acrylic, polystyrene, polyimide, polyamide, etc. The stress transmitting element may have a thickness in the range of 100 nm to 5 mm, including all values and increments therein, such as 100 nm to 1 μm, 1 μm to 500 μm, etc. Furthermore, while the piezo-element 30 is illustrated in FIGS. 5, 7A and 7B as generally being parallel to the photovoltaic component 18, the piezo-element 30 may be oriented in any manner, provided the piezo-element 30 is mechanically coupled directly or indirectly to the photovoltaic element so as to apply a stress to the photovoltaic component. Referring again to FIG. 7A, additional electrodes 16c, 16d are optionally provided between the piezo-element 30 and the photovoltaic component 18. Again, the electrodes may be formed from the above mentioned materials. In embodiments, as illustrated in FIG. 8, the piezo-element 30 is arranged in the same layer as the photovoltaic component 18 between the panels 12, such that the piezo-element does not overly any portion of the face of the photovoltaic component 18.

Figure 9:
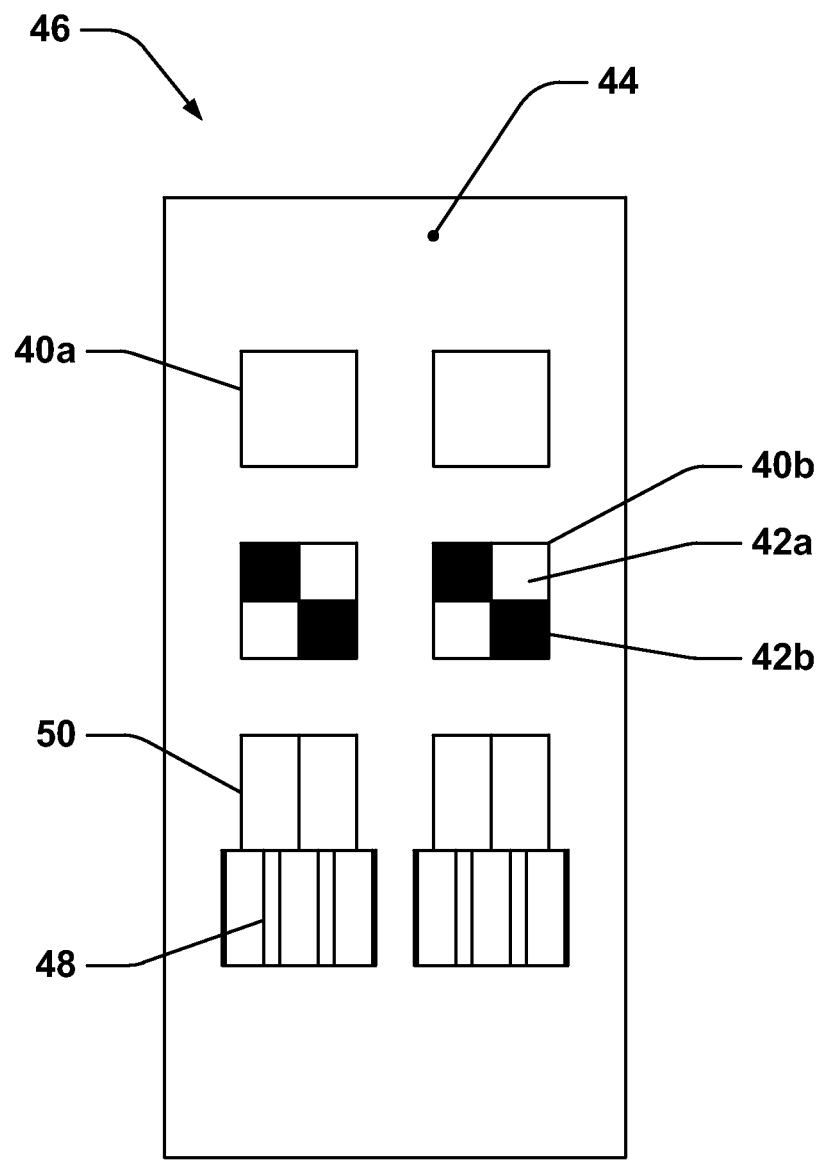
FIG. 9 is a schematic of a building façade, illustrating various applications of the photovoltaic windows in, not only windows, but also in balconies and doors.

As illustrated in FIG. 9, the activity of each window 40a, 40b or window segment 42a, 42b can be individually adjusted (from active to inactive, for example) via the piezo-elements or through other embodiments described further below. Adjustments in window activity may be made for various purposes, such as to optimize the amount of energy collected, provide ornamentality, optimize user experience, etc. For example, photovoltaic components provided in windows associated with a given face 44 of a building 46, when the face is exposed the sun, may be stressed or made active to obtain an increased absorption efficiency and absorb light not only in the UV, or IR, spectrums, but also in the visible spectrum. Further, in such a manner, the opacity of such windows is increased, reducing the amount of light, glare and undesired thermal energy entering such windows. On the other hand, photovoltaic components provided in windows associated with a face of a building that is not exposed to sun light may be unstressed, or reduced in stress, so as to increase the amount of visible light entering through those windows, although reducing the efficiency of the photovoltaic components. As alluded to above, the system herein also provides the ability for a person within a room to adjust the photovoltaic components so as to allow the desired amount of light into the room. It may also be appreciated, that the photovoltaic windows may used in other portions of the building façade, such as in balconies 48 or doors 50.

Figure 10A:
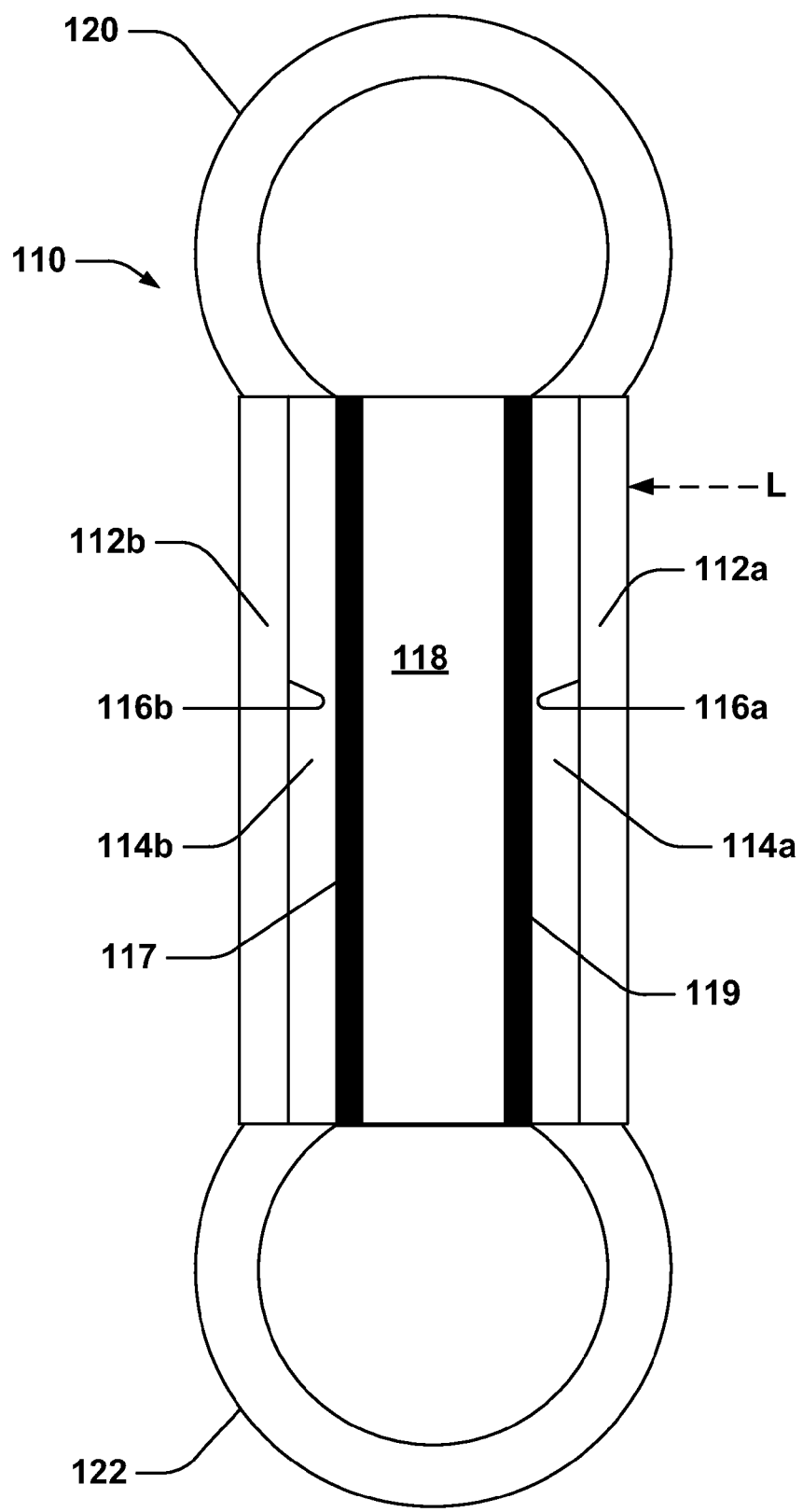
FIG. 10A illustrates a cross-sectional side view of a window, wherein a fluid constituent, forming at least a portion of a photovoltaic component, is interchangeable with a transparent fluid, such as a liquid or a gas, in a photovoltaic cell.

In a further embodiment, illustrated in FIGS. 10A though 10E, the photovoltaic component includes a fluid constituent, wherein the fluid constituent is selectively interchanged with a transparent fluid. A fluid is understood herein to refer to a material that flows under the application of a force, such as pressure or gravity, at room temperature (i.e., 21° C. to 25° C.). In embodiments, the photovoltaic component may also include a solid constituent, such as a photovoltaic material, semi-conductive material or photo-sensitive dye. A solid is generally understood herein as a material that does not flow at room temperature. When the solid constituent is not present, the fluid constituent is sufficient to generate current from the incident light. When the solid is present, the combination of the solid and fluid constituents generate current from the incident light.

As illustrated in FIG. 10A, the window 110 includes two panels 112a, 112b (hereinafter 112) and a photovoltaic cell. The photovoltaic cell includes electrode layers 114a, 114b disposed adjacent to the interior surfaces 116a, 116b of the panels 112a, 112b similar to embodiments above. The panels and electrodes are formed from the materials and methods described in the embodiments above. In addition, a gap 118 is defined between the electrodes and provides a volume to contain the fluid constituent, i.e., either a photocurrent generating fluid (which can generates current without the presence of a solid constituent), a p-type (or n-type) semi-conductor fluid (which generates current in the presence of a respective solid semi-conductor), an electrolyte (which generates current in conjunction with a photovoltaic material), which is selectively interchangeable with a transparent fluid between the panels to achieve an active or inactive state.

In embodiments, wherein a solid constituent 117 forms a portion of the photovoltaic component, the solid constituent is disposed on one or both of the electrodes 114a, 114b. Where a solid constituent is a photovoltaic material disposed on a surface of an electrode, the fluid constituent may include an electrolyte. In embodiments, where a p-(or n-type) semi-conductor is present as the solid constituent, the fluid constituent may include a corresponding semi-conductor, which may or may not be dissolved in a solvent or suspended in solution.

The gap thickness may be up to 5 mm, including all values and ranges therein, such as 50 nm to 100 μm, 1 mm to 5 mm, etc. An inlet manifold 120 is operatively coupled to the gap, providing fluid communication, to supply the photovoltaic fluid or transparent fluid to the gap 118, and an outlet manifold 122 is also operatively coupled to the gap 118, to allow the photovoltaic fluid or gas can be removed from the gap 118.

Again, in embodiments, an optional UV absorber 119 may be utilized as a layer in the window, or specifically incorporated into the photovoltaic cell. The UV absorber may be understood as a relatively wide-bandgap material that absorbs UV, i.e., absorbs at least 50% of incident light having a wavelength in the range of 1 nm to 410 nm, including all values and increments therein, such as 75% or greater, 90% or greater, etc. The UV absorber may be positioned proximal to the face of the window upon which sunlight is incident, such as between panel 112a and gap 118. For example, the UV absorber may be positioned between panel 112a and electrode layer 114a, or opposite the electrode layer. In such a manner, the UV absorber may shield other elements of the cell, such as organic infrared absorbing photovoltaic materials, from UV degradation.

Photovoltaic materials, when employed, may be formed of any of the above described photovoltaic materials. Other photovoltaic materials that may be disposed on one or more of the electrodes may include inorganic photovoltaic materials such as selenides, including copper indium gallium selenide, or tellurides. Examples of photosensitive dyes include metal based dyes, such as ruthenium, iridium, europium, phthalocyanine, or aluminum dyes, including for example, di-tetrabutylammonium cis-bis(isothiocyanato)bis (2,2'-bipyridyl-4,4'dicarboxylato)ruthenium (II), tris[2 (benzo[b]thiophen-2-yl) pyridinato-$C^3$, N]iridium(III), copper(II)phthalocyanine, etc. Other examples of photosensitive dyes include organic dyes such as polyaromatic dyes including coumarin 30, 7-methylbenzo[a]pyrene, etc.

Examples of semiconductors include n-type organic semiconductors such as 7,7,8,8-tetracyanoquinodimethane, 2,3, 5,6-tetrafluoro-7,7,8,8-tetracyanoquinodimethane, perylene-3,4,9,10-tetracarboxylic dianhydride, N,N'-diphenyl-3,4,9, 10-perlyenedicarboximide, etc.; or p-type semiconductors such as 5,5'-bis(2-hexyl-9H-fluoren-7-yl)-2,2'-bithiophene, α-sexithiophene, dibenzotetrathiafulvalene, etc.

Electrolytes and solvents include ionic liquids, which are organic salts that are liquid at, or around room temperature, such as salts of imidazolium, pyrrolidinium, acetate, bis (trifluoromethane-sulfonyl)imide (BTI), dicyanamide (DCI), hexafluorophosphate (HFP), tetrafluoroborate (TFB), or trifluoromethane-suflonate (TFS). Examples of such salts include, 1-ethyl-3-methylimidazolium thiocyanate, methyltrioctylammonium bis(trifluoromethylsulfonyl)imide, 1-butyl-4-methylimidazolium hexafluorophosphate, tetrabutylammonium tetrafluoroborate, etc.

Photocurrent generating fluids include, for example, photovoltaic materials suspended as particles in an electrolyte or dissolved in a solvent. The photovoltaic materials, electrolytes and solvents include those described above. As noted above photocurrent generating fluids generate current upon exposure to light and it is not necessary to provide a solid constituent. Similarly, the transparent fluid is a gas, such as an inert gas, or a liquid. Inert gasses may include nitrogen, argon or neon.

In addition, when both the transparent fluid and the fluid constituent are liquids, the liquids are immiscible. Stated, another way, the Hildebrand solubility parameter values of the fluid constituent of the photovoltaic cell ($\delta_1$) and the transparent fluid ($\delta_2$) are greater than +/−2.0 units of one another as measured in $(MPa)^{1/2}$. Accordingly, the fluid constituent and the transparent are selected such that the difference in solubility parameters between them may be greater than, e.g., +/−3.0 units of one another, or greater than, e.g., +/−4.0 units of one another, etc. Those skilled in the art may appreciate that the Hildebrand solubility parameter represents the square root of the cohesive energy density and provides a numerical estimate of the degree of interaction of selected materials.

In this embodiment, the fluid constituent may absorb at least 50% of incident light L having 1) one or more wavelengths in the range of less than 410 nm, such as between 1 nm to 410 nm, including all values and ranges therein, such as in the range of 10 nm to 100 nm, 100 nm to 410 nm, etc.; 2) one or more wavelengths in the range of greater than 650 nm, such as between 650 nm to 1,500 nm, including all values and ranges therein, such as in the range of 650 nm to 850 nm, etc.; 3) one or more wavelengths in the range of 410 nm to 650 nm, including all values and ranges therein; 4) in both ranges of less than 410 nm and greater than 650 nm; or 5) in all of the ranges above. In examples at least 60%, at least 70%, at least 80% or at least 90% of light may be absorbed. Further, the transparent fluid may allow at least 50% of incident light L, including all values and ranges therein, having one or more wavelengths in the range of 1 nm to 1,500 nm, including all values and ranges therein to pass through the fluid. In examples, at least 60%, at least 65%, at least 70%, at least 75%, at least 80%, at least 85%, at least 90%, or at least 95% of incident light passes through the panel exhibiting wavelengths from 1 nm to 410 nm, 410 nm to 650 m, or 650 nm to 1,500 nm. In further embodiments, the transparent fluid may be a UV absorbing (i.e., absorbs light having a wavelength of less than 410 nm) or IR absorbing (i.e., absorbs light having a wavelength of greater than 650 nm) semiconductor.

Figure 10B:
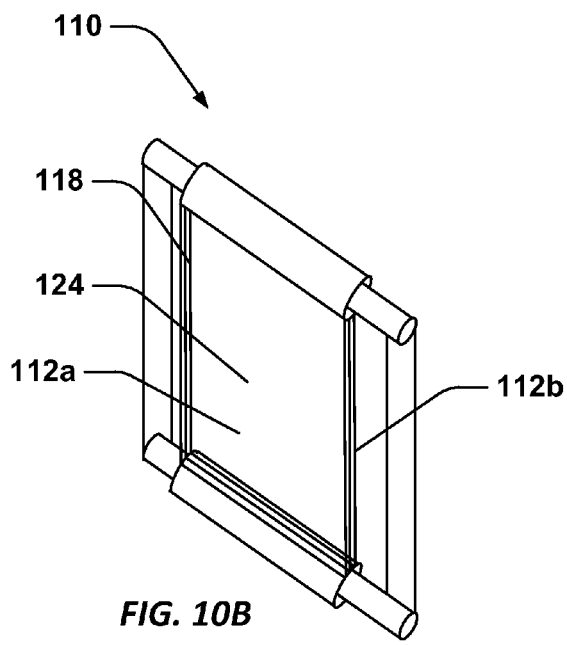
FIG. 10B illustrates a perspective view of the window of FIG. 10A wherein a gas is provided in the gap between the panels.
Figure 10C:
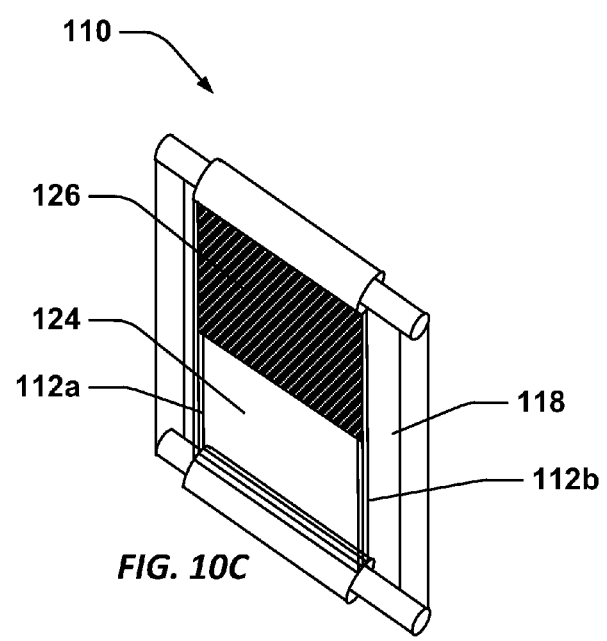
FIG. 10C illustrates a perspective view of the window of FIG. 10A wherein a gas is being interchanged with a fluid constituent in the gap between the panels.
Figure 10D:
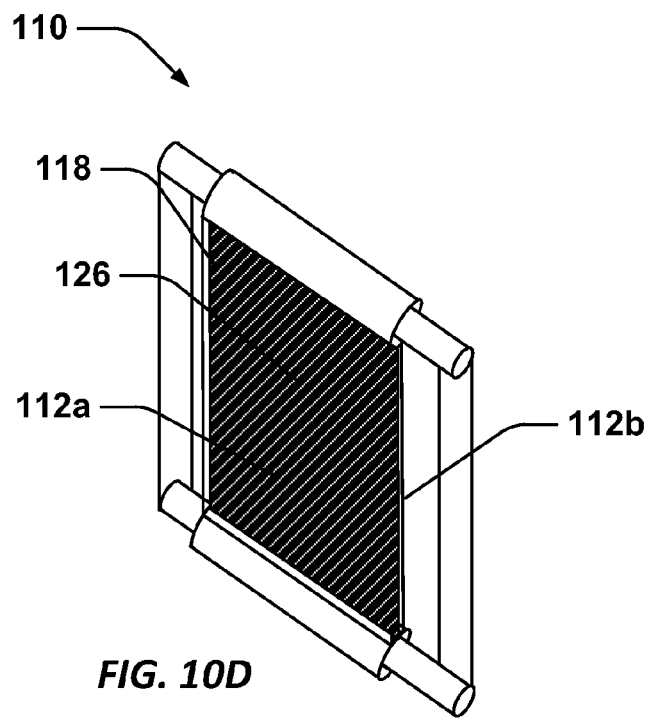
FIG. 10D illustrates a perspective view of the window of FIG. 10A wherein a fluid constituent is provided in the gap between the panels.
Figure 10E:
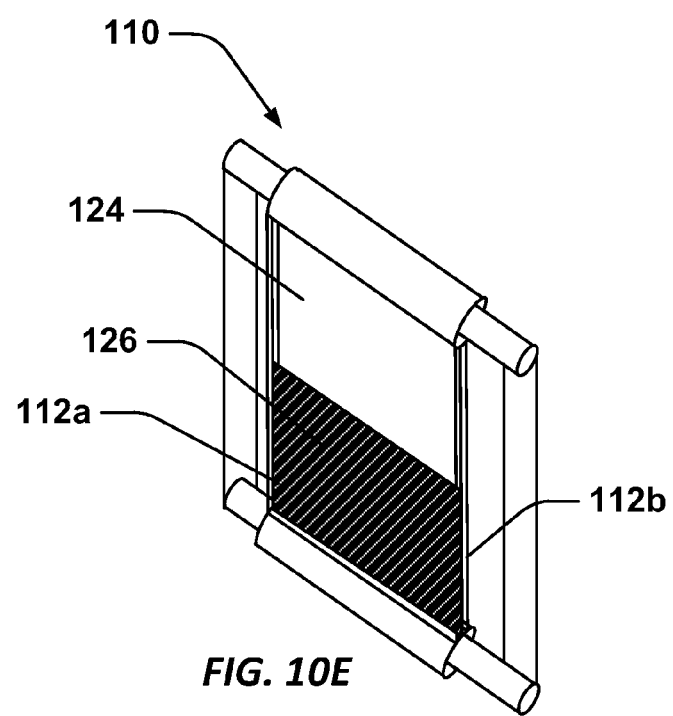
FIG. 10E illustrates a perspective view of the window of FIG. 10A wherein the fluid constituent is being interchanged with a gas in the gap between the panels.

FIGS. 10B through 10E illustrate the transition from the transparent fluid, to the fluid constituent, (i.e., the photocurrent generating fluid, the semiconductor fluid or electrolyte), and back to the transparent fluid. As alluded to above, when the transparent fluid is present, the window exhibits a relatively greater transparency, wherein when the fluid constituent is placed in the gap, the transparency of the window decreases. Beginning in a relatively transparent state, as seen in FIG. 10B, gas 124, for example, may be provided in the gap 118 between the panels 112a, 112b of the window 110. In this state, the fluid constituent is not present in the photovoltaic cell and the photovoltaic cell is not active. When it is desired to render the photovoltaic cell active, the fluid constituent 126 is supplied into the gap 118, displacing the gas 124 as illustrated in FIG. 10C, until a portion, if not all of the area coextensive with the window face is filled with the fluid constituent 126 as illustrated in FIG. 10D. The fluid constituent 126 may render the window relatively less transparent, allowing less incident light to pass through, than the gas. When it is no longer desired to make the photovoltaic cell active, the fluid constituent 126 may be displaced by gas 124 as illustrated in FIG. 10E. In embodiments, this transition between the fluids may be accomplished under pressure or vacuum. Vacuum may particularly be used when a gas is provided between the panels.

Figure 11:
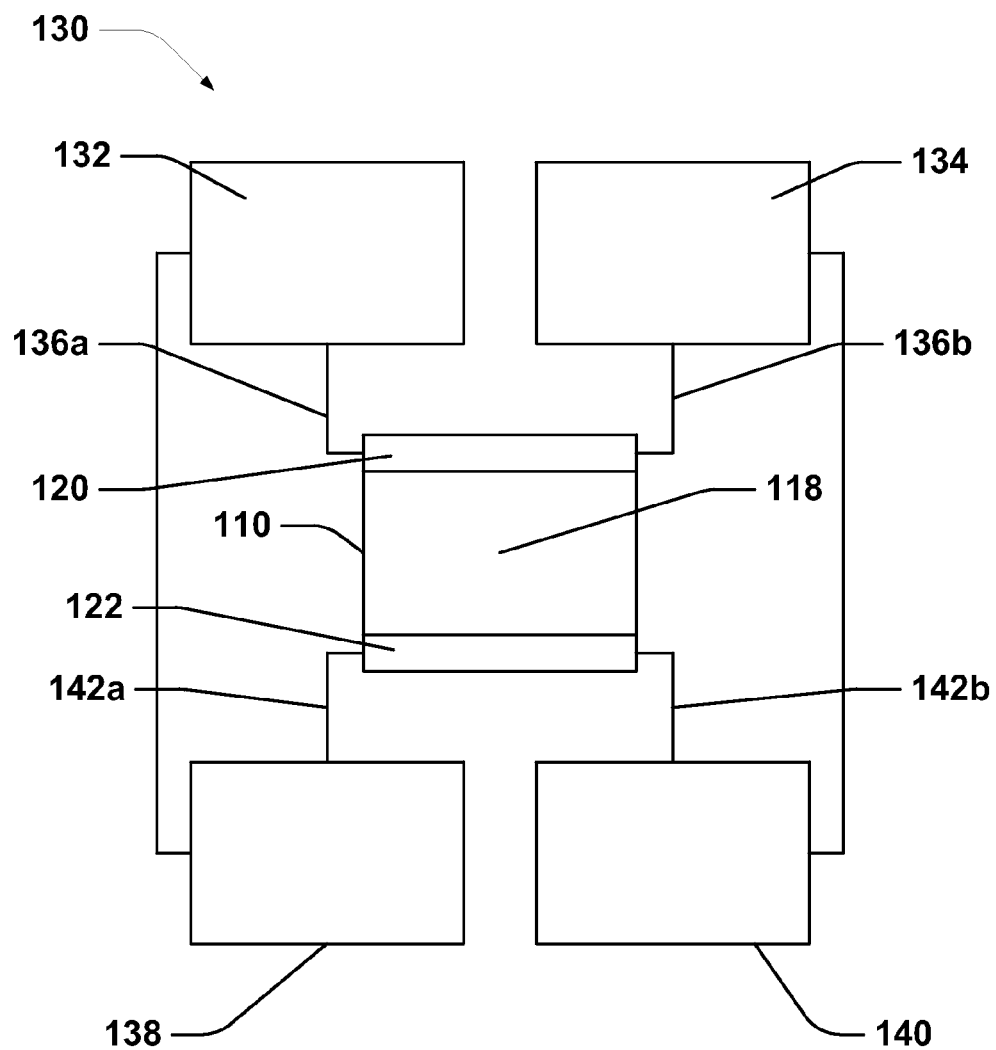
FIG. 11 illustrates a schematic diagram of a fluid supply system for providing a photocurrent generating fluid to the window of FIG. 10A.

The fluid constituent and transparent fluid may be selectively removed or supplied by a fluid supply system, an example of which is illustrated in FIG. 11. As noted above, the fluid supply system 130 may include at least one inlet manifold 120 and at least one outlet manifold 122, in communication with the gap 118 in the photovoltaic window 110. Further, a fluid constituent supply reservoir 132 and transparent fluid supply reservoir 134 are provided in fluid communication with the inlet manifold via piping 136a, 136b. Various valves, pumps, vacuums or other flow control devices may be positioned along the piping to regulate or pressurize the fluid being supplied to the gap 118. In addition, when the transparent fluid and fluid constituent are removed from the gap 118, the fluids may be received in outlet manifold 122 and fed through piping 142a, 14b into a fluid constituent return reservoir 138 and gas return reservoir 140. Again, various valves, pumps vacuums or other flow control devices may be incorporated into the system such as via piping 142a, 142b, to regulate the flow of the fluids from the outlet manifold to the return reservoirs 138, 140. As illustrated in FIG. 11, the fluid supply system, the fluid constituent and transparent fluid are optionally recycled through the system for later use.

Figure 12A:
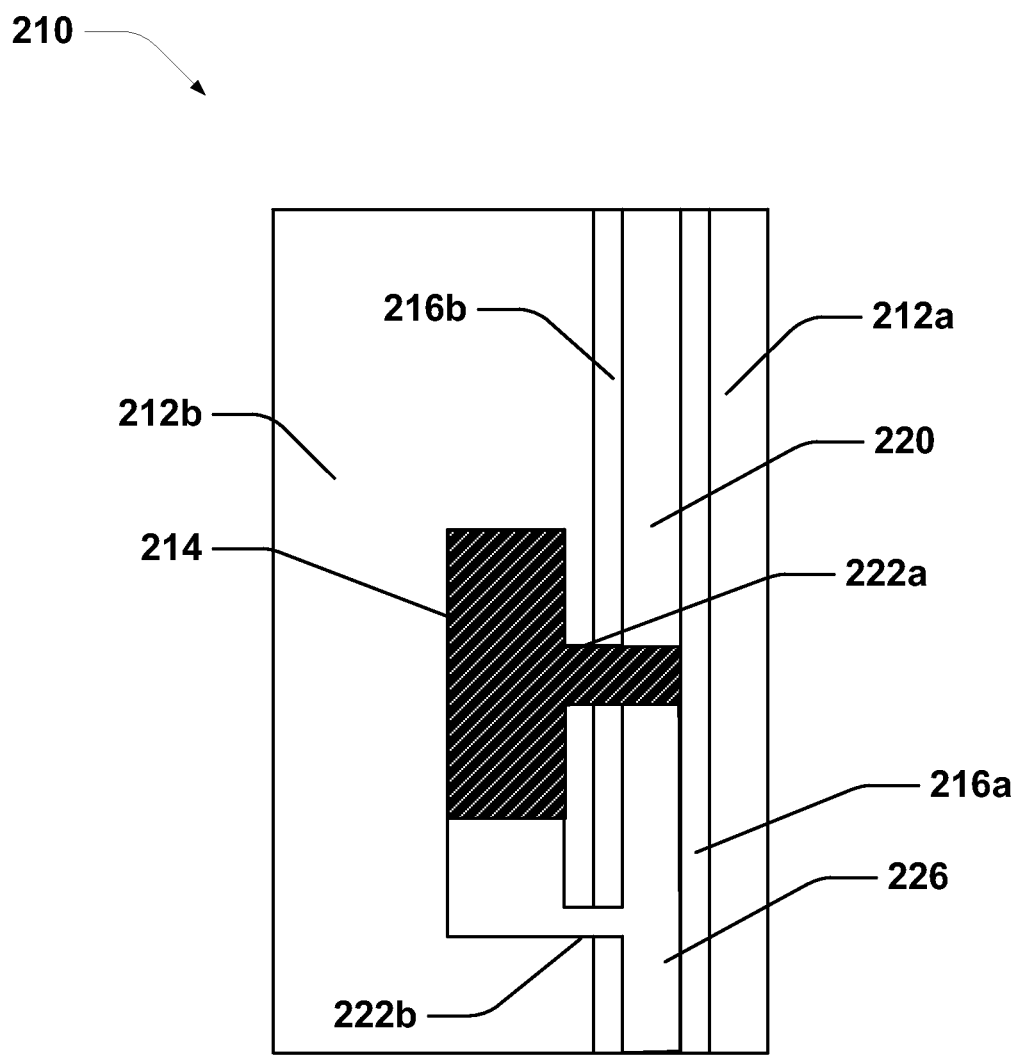
FIG. 12A illustrates a side cross-sectional view of a window including a gap between panels, a reservoir for storing a photocurrent generating fluid when the photovoltaic cell is in an inactive state, and a passageway for communicating said photocurrent generating fluid to the gap from said reservoir when the photovoltaic cell is in an active state.
Figure 12B:
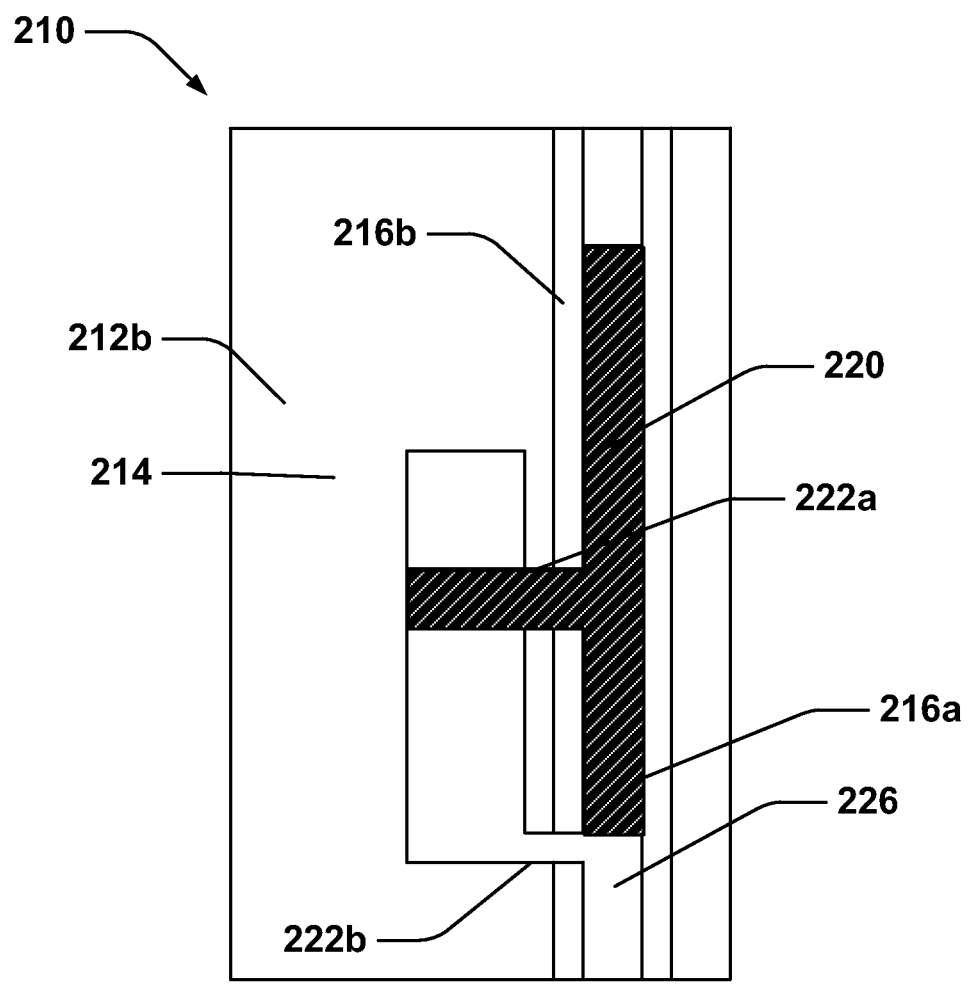
FIG. 12B illustrates a side cross-sectional view of a window including a gap between panels, a reservoir for storing a photocurrent generating fluid when the photovoltaic cell is in an inactive state, and a passageway for communicating said photocurrent generating fluid to the gap from said reservoir when the photovoltaic cell is in an active state.

In yet a further embodiment, illustrated in FIGS. 12A and 12B, similar to electrocapillarity or a bi-stable electrocapillary device, the fluid constituent is a photocurrent generating fluid that flows from a reservoir into a gap to provide a greater light absorbing area. That is, while in the reservoir, the photocurrent generating fluid is coextensive with a relatively small area across the face of the window and when transition into the gap the photocurrent generating fluid is coextensive with a relatively large area of the window face. Specifically, the window 210 includes at least two panels 212a, 212b and a reservoir 214 is defined in one of the panels 212b. The panel 212b is formed of one layer or multiple layers laminated together and of the materials described in the embodiments above. Also, similar to the embodiments described above, electrodes 216a, 216b are provided adjacent to the interior panel surfaces 218a, 218b formed of the materials and in a manner described in the above embodiments. The reservoir 214 is in fluid communication with a gap 220 between the panels 212a, 212b, wherein one or more passageways 222a, 222b defined in the panel 212b connects the reservoir 214 to the gap 220. One of the passageways 222b is a secondary passage and relatively smaller than the primary passageway 222a through which the photocurrent generating fluid 224 flows. An electrolyte solution 226 is provided in the gap 220 and surrounding the photocurrent generating fluid 226.

The photocurrent generating fluid 224 and electrolyte solution 226 are immiscible and do not combine to form a solution. Stated, another way, the Hildebrand solubility parameter values of the electrolyte ($\delta_1$) and the photocurrent generating fluid ($\delta_2$) are greater than +/−2.0 units of one another as measured in $(MPa)^{1/2}$. Accordingly, the photocurrent generating fluid and the electrolyte solution are selected such that the difference in solubility parameters between them may be greater than, e.g., +/−3.0 units of one another, or greater than, e.g., +/−4.0 units of one another, etc. Again, those skilled in the art may appreciate that the Hildebrand solubility parameter represents the square root of the cohesive energy density and provides a numerical estimate of the degree of interaction of selected materials.

In the inactive state, the photocurrent generating fluid is coextensive with less than 50% of the area defined by the face of the panels and electrolyte solution 226 is located in the gap 220. In this state, the window may be relatively transparent allowing at least 50% of incident light L having one or more wavelengths in the range of 410 nm to 650 nm to pass through the panel. In examples, at least 60%, at least 65%, at least 70%, at least 75%, at least 80%, at least 85%, at least 90%, or at least 95% of incident light passes through the panel exhibiting wavelengths from 410 nm to 450, 450 nm to 495 nm, 495 nm to 570 nm, 570 nm to 590 nm, 590 nm to 650 nm.

In the active state, the photocurrent generating fluid 224 is moved into the gap 220 and is coextensive with 50% or more of the face of the panels. In this state, the window may be relatively less transparent allowing at less than 50% of incident light L having one or more wavelengths in the range of 1 nm to 1,500 nm to pass through the panel. In examples, at less than 45%, less than 40%, less than 35%, less than 30%, less than 25%, less than 20%, less than 15%, less than 10%, etc., of incident light passes through the panel exhibiting wavelengths from 1 nm to 410 nm, 410 nm to 450, 450 nm to 495 nm, 495 nm to 570 nm, 570 nm to 590 nm, 590 nm to 650 nm or 650 nm to 1,500 nm.

The photovoltaic cell is configured, or transitioned from an inactive to an active state or vice versa, by applying a pulsed voltage to the electrodes 216a, 216b lining the gap 220. The voltage is in the range of +/−1 volts including all values and increments therein. Upon applying a voltage, and transitioning to an active state, the interfacial tension between the fluids is altered and the photocurrent generating fluid may flow from the reservoir and into the gap. Further, the electrolyte solution flows from the gap into the reservoir.

While the embodiments herein, are directed to generating solar power, that is sunlight incident on the outside of a building, light generated inside of a building may be harnessed as well. For example, desk lamps and ceiling lights may provide light at electromagnetic wavelengths that are captured by the photovoltaic cells embedded in the windows. This provides for power generation even at night when space inside the building is illuminated.

Figure 13:
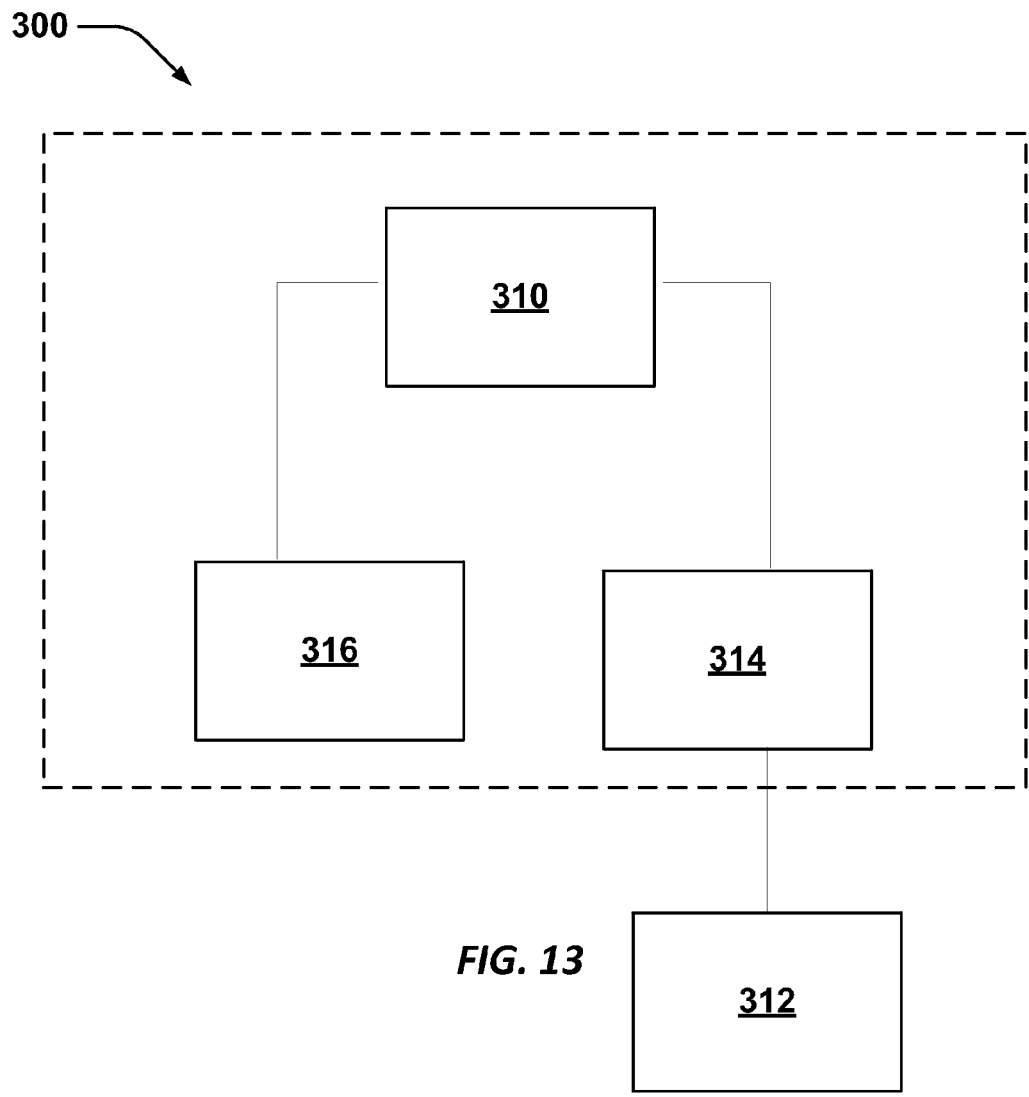
FIG. 13 illustrates a schematic of control circuitry.

The circuitry described above, with reference to FIG. 1, also optionally includes control circuitry. As illustrated in FIG. 13, the control circuitry 300 is operatively coupled to one or more the photovoltaic cells 312 and used to transition the photovoltaic cells in the windows described herein from an active state to an inactive state, such as by stressing a photocurrent generating or causing a photocurrent generating fluid to flow into a photovoltaic cell. Operatively coupling is understood herein as providing an electrical connection (including a wireless connection), mechanical connection or both. As illustrated in FIG. 13, the control circuitry 300 includes, in embodiments, a processor 310, window interfaces 314, as well as one or more user interfaces 316.

The processor may be configured to receive instructions from a user interface that indicates whether a specific window should be active or inactive, a period of time that the window should be active or inactive for, the default setting for the window, etc. Based on these instructions the processor may identify the window and send instructions, i.e., signals to the window, through window interfaces that activate or deactivate the windows. Window interfaces may include wiring or wireless devices coupling the processor to the windows, and in particular, to piezo elements or to elements (e.g., valves) in a fluid supply system. The user interface 316 may include a display, a mouse, a keyboard or other devices. Communication between the components of the control circuitry may be through electrical wires or performed wirelessly.

Any of the operations described herein may be implemented in a system that includes one or more tangible storage mediums having stored thereon, individually or in combination, instructions that when executed by one or more processors perform the methods. Here, the processor may include, for example, a system CPU and/or other programmable circuitry. Also, it is intended that operations described herein may be distributed across a plurality of physical devices, such as processing structures at more than one different physical locations. The storage medium may include any type of tangible medium, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

Accordingly, in embodiments, the present disclosure relates to an apparatus for collecting solar energy. The apparatus comprises a first panel, wherein the first panel allows at least 50% of incident light having a wavelength in the range of 1 nm to 1,500 nm to pass through the panel and a second panel, wherein the second panel allows at least 50% of incident light having a wavelength in the range of 410 nm to 650 nm to pass through the panel. In addition, the apparatus comprises a photovoltaic cell between the first panel and second panel. The photovoltaic cell includes a first electrode disposed adjacent to an interior surface of the first panel, a second electrode disposed adjacent to the interior surface of the second panel, and a photovoltaic component between said first and second electrodes. The photovoltaic component absorbs at least 50% of light having a wavelength in one of the following ranges: greater than 650 nm, less than 410 nm and combinations thereof.

In the above embodiment, the photovoltaic cell further comprises a piezo-element mechanically coupled to said photovoltaic component. The face of the photovoltaic component defines an area and the photovoltaic cell optionally further comprises a stress transmitting element mechanically coupled to the piezo-element, wherein the piezo-element is coextensive with less than 50% of the area defined by the photovoltaic component face.

In any of the above embodiments, the photovoltaic component has a bandgap of 3.0 eV or greater or has a bandgap of 1.9 eV or less. Further, in any of the above embodiments, the photovoltaic component exhibits a bandgap of 3.0 eV or greater and a bandgap of 1.9 eV or less.

Further, in any of the above embodiments, the apparatus includes a plurality of photovoltaic cells arranged in between the panels in a non-overlapping manner.

In any of the above embodiments, the photovoltaic component includes a fluid constituent and the apparatus further comprises a fluid supply system. The fluid supply system is configured to remove the fluid constituent from a gap defined between the first panel and second panel. In addition, the fluid supply system is optionally configured to exchange the fluid constituent with a transparent fluid in said gap. The photovoltaic component also optionally includes a solid constituent disposed on at least one of the electrodes contacting the fluid constituent. Alternatively, in any of the above embodiments, the first and second panels define a gap therebetween and the first panel includes a reservoir and a passageway, which defines an opening between the reservoir and the gap. The photovoltaic component includes a photocurrent generating fluid that is flowable between the reservoir and the gap.

The apparatus may be incorporated into a system for collecting solar energy. The system comprises a plurality of windows, as described in the embodiments above, and circuitry to which said photovoltaic cells are operatively coupled, wherein said circuitry is configured to supply collected energy to a power supply system.

In any of the above embodiments incorporating a piezo-element, the circuitry includes control circuitry configured to activate said piezo-element. In any of the above embodiments incorporating a fluid constituent, the circuitry includes control circuitry configured to selectively remove the fluid constituent from a gap between the panels.

The present disclosure also relates to a method for configuring a solar energy collection window, including any of the above embodiments incorporating a photovoltaic fluid. The method includes displacing a transparent fluid from a gap formed between a first panel and a second panel, each panel having an electrode disposed adjacent to the interior surface of the panel, supplying a fluid constituent from a reservoir to the gap, and collecting light energy with the fluid constituent. The transparent fluid allows at least 50% of incident light L, including all values and ranges therein, having one or more wavelengths in the range of 1 nm to 1,500 nm. The fluid constituent absorbs at least 50% of incident light L having either: 1) one or more wavelengths in the range of less than 410 nm, such as between 1 nm to 410 nm, including all values and ranges therein, such as in the range of 10 nm to 100 nm, 100 nm to 410 nm, etc., 2) one or more wavelengths in the range of greater than 650 nm, such as between 650 nm to 1,500 nm, including all values and ranges therein, such as in the range of 650 nm to 850 nm, etc., 3) one or more wavelengths in the range of 410 nm to 650 nm, including all values and ranges therein, 4) in both ranges of less than 410 nm and greater than 650 nm, or 5) in all of the ranges above.

In any of the above embodiments of the method, the method further comprises displacing the fluid constituent from the gap and supplying the transparent fluid into the gap. In any of the above embodiments, the transparent fluid is a gas. In any of the above embodiments, a solid constituent is included in the photovoltaic component.

In any of the above embodiments of the method, the method further comprises applying a pulsed voltage to the first and second electrodes, wherein the fluid constituent flows from the reservoir into the gap. The reservoir is defined in the first panel, and a passageway is defined in the first panel providing fluid communication between the reservoir and the gap. Further, the transparent fluid is an electrolyte.

The present disclosure also relates to a method of configuring a solar power energy window, in any of the above embodiments wherein a piezo-element is coupled to a photovoltaic component included in a window. In such methods, the piezo-element is activated and a stress is applied to the photovoltaic component with the piezo-element, changing the bandgap of the photovoltaic component from a first bandgap to a second bandgap.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. An apparatus for converting solar energy, comprising:
 a first panel, wherein said first panel allows at least 50% of incident light having a wavelength in the range of 1 nm to 1,500 nm to pass through said first panel;
 a second panel, wherein said second panel allows at least 50% of incident light having a wavelength in the range of 410 nm to 650 nm to pass through said second panel; and
 a photovoltaic cell disposed between said first panel and said second panel wherein said photovoltaic cell allows incident light wavelengths in the range of 410 nm to 650 nm to pass through and includes:
  a first electrode disposed adjacent to said first panel,
  a second electrode disposed adjacent to said second panel,
  a photovoltaic component contacting said first and second electrodes, wherein said photovoltaic component absorbs at least 50% of light having a wavelength in one of the following ranges: greater than 650 nm, less than 410 nm and combinations thereof, wherein said photovoltaic component comprises at least two layers, a first layer that exhibits a bandgap of 3.0 eV or greater and a second layer that exhibits a bandgap of 1.9 eV or less.

2. The apparatus of claim 1, wherein said photovoltaic cell further comprises a piezo-element mechanically coupled to said photovoltaic component.

3. The apparatus of claim 2, wherein a face of said photovoltaic component defines an area and said photovoltaic cell further comprises a stress transmitting element mechanically coupled to said piezo-element, wherein said piezo-element is coextensive with less than 50% of said area defined by said face.

4. The apparatus of claim 1, including a plurality of photovoltaic cells arranged in between said first panel and said second panel in a non-overlapping manner.

5. The apparatus of claim 1, wherein said photovoltaic component includes a fluid constituent, and said apparatus further comprises a fluid supply system configured to selectively remove said fluid constituent from a gap defined between said first panel and said second panel.

6. The apparatus of claim 5, further comprising a transparent fluid, wherein during operation of said apparatus said fluid supply system is configured to exchange said fluid constituent with said transparent fluid in said gap.

7. The apparatus of claim 5, wherein said photovoltaic component further includes a solid constituent disposed on at least one of said first electrode and said second electrode and contacts said fluid constituent.

8. The apparatus of claim 1, wherein said first panel and said second panel define a gap therebetween and said first panel includes a reservoir and a passageway, wherein said passageway defines an opening between said reservoir and said gap, wherein said photovoltaic component includes a photocurrent generating fluid and is flowable between said reservoir and said gap during operation of the apparatus.

9. A system for converting solar energy, comprising:
a plurality of windows, wherein each window includes:
a first panel, wherein said first panel allows at least 50% of incident light having a wavelength in the range of 1 nm to 1 cm to pass through said first panel;
a second panel, wherein said second panel allows at least 50% of incident light having a wavelength in the range of 410 nm to 650 nm to pass through said second panel; and
a photovoltaic cell disposed between said first panel and said second panel wherein said photovoltaic cell allows incident light wavelengths in the range of 410 nm to 650 nm to pass through and includes:
a first electrode disposed adjacent to an interior surface of said first panel,
a second electrode disposed adjacent to an interior surface of said second panel,
a photovoltaic component contacting said first electrode and said second electrode, wherein said photovoltaic component absorbs at least 50% of light having a wavelength in one of the following ranges: greater than 650 nm, less than 410 nm and combinations thereof, wherein said photovoltaic component comprises at least two layers a first layer that exhibits a bandgap of 3.0 eV or greater and a second layer that exhibits a bandgap of 1.9 eV or less; and
circuitry to which said photovoltaic cells are in each of said windows is operatively coupled, wherein said circuitry is configured to supply converted energy to a power supply system.

10. The system of claim 9, wherein said photovoltaic cell further comprises a piezo-element mechanically coupled to said photovoltaic component.

11. The system of claim 10, wherein said photovoltaic component defines face having a surface area and said piezo-element is coextensive with less than 50% of said surface area and said photovoltaic cell further comprises a stress transmitting element mechanically coupled to said piezo-element and said photovoltaic component.

12. The system of claim 11, wherein said circuitry includes control circuitry configured to activate said piezo-element.

13. The system of claim 9, wherein said photovoltaic component includes a fluid constituent, and said system further comprises a fluid supply system configured to selectively remove said fluid constituent from a gap defined by said first and second panels during operation of said system.

14. The system of claim 13, wherein said circuitry includes control circuitry configured to selectively remove said fluid constituent from said gap.

15. The system of claim 13, further comprising a transparent fluid, wherein said fluid supply system is configured to exchange said fluid constituent with said transparent fluid in said gap.

16. The system of claim 9, wherein said first panel and said second panel define a gap therebetween and at least one of said first panel and said second panel includes a reservoir and a passageway defining an opening between said reservoir and said gap, wherein said photovoltaic component includes a photocurrent generating fluid that is flowable between said reservoir and said gap during operation of the system.

17. The system of claim 16, wherein said circuitry includes control circuitry configured to selectively remove said photocurrent generating fluid from said gap.

* * * * *